United States Patent
Henmi et al.

(10) Patent No.: US 8,456,787 B2
(45) Date of Patent: Jun. 4, 2013

(54) GAS INSULATED SWITCHGEAR

(75) Inventors: Rei Henmi, Hitachi (JP); Kyuji Yaginuma, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 131 days.

(21) Appl. No.: 13/123,080

(22) PCT Filed: Oct. 2, 2009

(86) PCT No.: PCT/JP2009/067589
§ 371 (c)(1),
(2), (4) Date: Apr. 7, 2011

(87) PCT Pub. No.: WO2010/041724
PCT Pub. Date: Apr. 15, 2010

(65) Prior Publication Data
US 2011/0205681 A1    Aug. 25, 2011

(30) Foreign Application Priority Data
Oct. 9, 2008 (JP) ................. 2008-262614

(51) Int. Cl.
H02H 3/20 (2006.01)
H02H 9/04 (2006.01)
H02H 1/00 (2006.01)
H02H 1/04 (2006.01)
H02H 3/22 (2006.01)
H02H 9/06 (2006.01)

(52) U.S. Cl.
USPC .......................................... 361/91.1; 361/117

(58) Field of Classification Search
USPC ................................ 361/117, 91.1
See application file for complete search history.

(56) References Cited

U.S. PATENT DOCUMENTS
2003/0098765 A1 * 5/2003 Kakuda et al. ................ 336/174

FOREIGN PATENT DOCUMENTS
| JP | 56-65624 | 6/1981 |
| JP | 56-66121 | 6/1981 |
| JP | 58-123304 | 7/1983 |
| JP | 10-185961 | 7/1998 |
| JP | 2003-164024 | 6/2003 |

OTHER PUBLICATIONS

Burghardt D; HV gas insulated switchgear has bridge with varistors at each joint flange for connecting sections together when overvoltage transient occurs; Publication Date: Apr. 6, 1988.*

* cited by examiner

*Primary Examiner* — Dharti Patel
(74) *Attorney, Agent, or Firm* — Brundidge & Stanger, P.C.

(57) ABSTRACT

Bus container 1 of cylindrical shape is filled with insulating gas and main circuit conductor 2 is housed with bus container 1 in taut condition. Bus container 1 has flange 3. Current transformer container 4 is installed adjacently to bus container 1. Current transformer container 4 includes inner cylinder 5 and outer sealing member 6. On the periphery of inner cylinder 5, three current transformers 11 are provided interposing insulative cushioning material 10. Other longitudinal end of inner cylinder 5 and bus container 1 are arranged so that insulation gap 9 is formed in between. Between inner cylinder 5 and outer sealing member 6 on insulation gap 9 side, varistor 15 of which resistance varies depending on a applied voltage is electrically connected through bonding conductor 16. Varistor 15 turns into a conducting state when a surge voltage over a predetermined intensity is applied.

3 Claims, 2 Drawing Sheets

GAS INSULATED SWITCHGEAR

TECHNICAL FIELD

The present invention relates to a gas insulated switchgear filled with insulating gas having a current transformer container provided for measuring currents flowing through main circuit conductors of the switchgear.

BACKGROUND ART

In general, gas insulated switchgears are widely used to provide switching function in electric power systems for power transmission, distribution, and receiving or servicing. Main circuit conductors in gas insulated switchgears are arranged in a phase-separation configuration or a three-phase-in-one-housing layout.

For measuring the current flowing through each of the main circuit conductors in the phase-separation configuration, a current transformer container is provided adjacently to a bus container in which the main circuit conductor is accommodated in taut condition. The current transformer container is comprised of an inner cylinder and an outer sealing member and the current transformer is installed on the outer circumference of the inner cylinder. The current transformer is installed in multiple as the capacity of the gas insulated switchgear increases.

The current transformer is a window-type instrument current transformer, in which the main circuit conductor is the single-turn primary conductor thereof and the secondary winding of the current transformer installed on the outer circumference of the inner cylinder is the secondary conductor thereof. To the secondary winding of the current transformer, a current measuring circuit is connected as the secondary circuit for metering the current flowing through the main circuit conductor detected by the current transformer. The current transformer container of this fashion has been described in, for example, Japanese patent application JP 2003-164024 A1 (Literature 1).

In the meantime, the bus container, which houses the main circuit conductor, and the current transformer container are grounded from the viewpoint of the safety assurance. This configuration makes the inner cylinder and the outer sealing member of the current transformer container form a closed loop. As the consequence of this, current induced by the main circuit conductor flows in the current transformer container (the inner and the outer sealing members) with the accuracy of the current measuring with the current transformer reduced. To prevent this, an insulation gap is formed between one longitudinal end of the inner cylinder and the bus container.

In a gas insulated switchgear by the way, a large switching surge that appears on the switching operation of a circuit breaker, which is a disconnecting switch, or of a earthing switch propagates through the main circuit conductor in a form of a traveling wave. This traveling wave induces a high-frequency surge voltage in the bus container that confronts the main circuit conductor according to the inductance of the bus container, static capacity between the main circuit conductor and the bus container, and other particulars related thereto.

Propagation of induced surge voltage traveling in the bus container is disturbed by an insulation gap formed between the inner cylinder of the current transformer container and the bus container. This disturbance of propagation generates a surge voltage between the outer sealing member of the current transformer container and the main circuit conductor. Thus, the current transformer becomes to be exposed to the surge voltage appeared between the outer sealing member of the current transformer container and the main circuit conductor and is coupled to the surge voltage through stray capacities. Then, a surge voltage is induced in the current transformer and the induced surge voltage propagates into the secondary circuit.

The magnitude of the surge voltage induced in the current transformer reaches tens of thousands of volts at its peak with frequency components of several MHz to several tens of MHz depending on the rated voltage of the gas insulated switchgear, the diameter of the current transformer container, and other elements.

Conventionally, a surge absorber such as a varistor is provided within the current metering circuit, which is the secondary circuit, to protect electronic parts composing the current metering circuit from the surge voltage.

DISCLOSURE OF INVENTION

In conventional arts, protection from the surge voltage is provided by installing a surge absorber within the current measuring circuit, which is the secondary circuit. This technique however still has a problem in that the reliability of the secondary circuit is greatly reduced because applying an excessive surge voltage on the secondary circuit will increase a risk of damaging electronic components therein.

The object of the present invention is to provide a gas insulated switchgear that is conducive to the stability of electric power systems by enhancing the reliability of the secondary circuit of a current transformer.

The present invention includes a surge voltage suppressing means is provided between an inner cylinder and an outer sealing member of the current transformer container. The surge voltage suppressing means establishes a short circuit therebetween when induced voltage caused by switching surge is applied between those inner and outer sealing members.

A preferable example as the surge voltage suppressing means in the present invention uses a non-linear resistor such as a varistor, which is electrically connected between the inner and the outer sealing members. The non-linear resistor turns into a conducting state when induced surge voltage over a predetermined intensity is applied across the resistor.

Another example of the surge voltage suppressing means uses a high-dielectric constant material coated plate, which is affixed on the flange of the bus container and is electrically connected to one longitudinal end of the inner cylinder. The high-dielectric constant material coated plate behaves as a high-impedance element in the commercial frequency range and as a low-impedance element in the high-frequency range of the switching surge.

EFFECT OF INVENTION

The present invention can suppress the intensity of the surge voltage applied on the secondary circuit of the current transformer because the inner cylinder and the outer sealing member of the current transformer container short to each other when the induced surge voltage caused by the switching surge is applied between them. Therefore, this mechanism is conducive to the stability of electric power systems by enhancing the reliability of the secondary circuit of a current transformer.

BEST MODE FOR CARRYING OUT THE INVENTION

The following explains an embodiment of the present invention referring to drawings.

Embodiment 1

Figure 1:
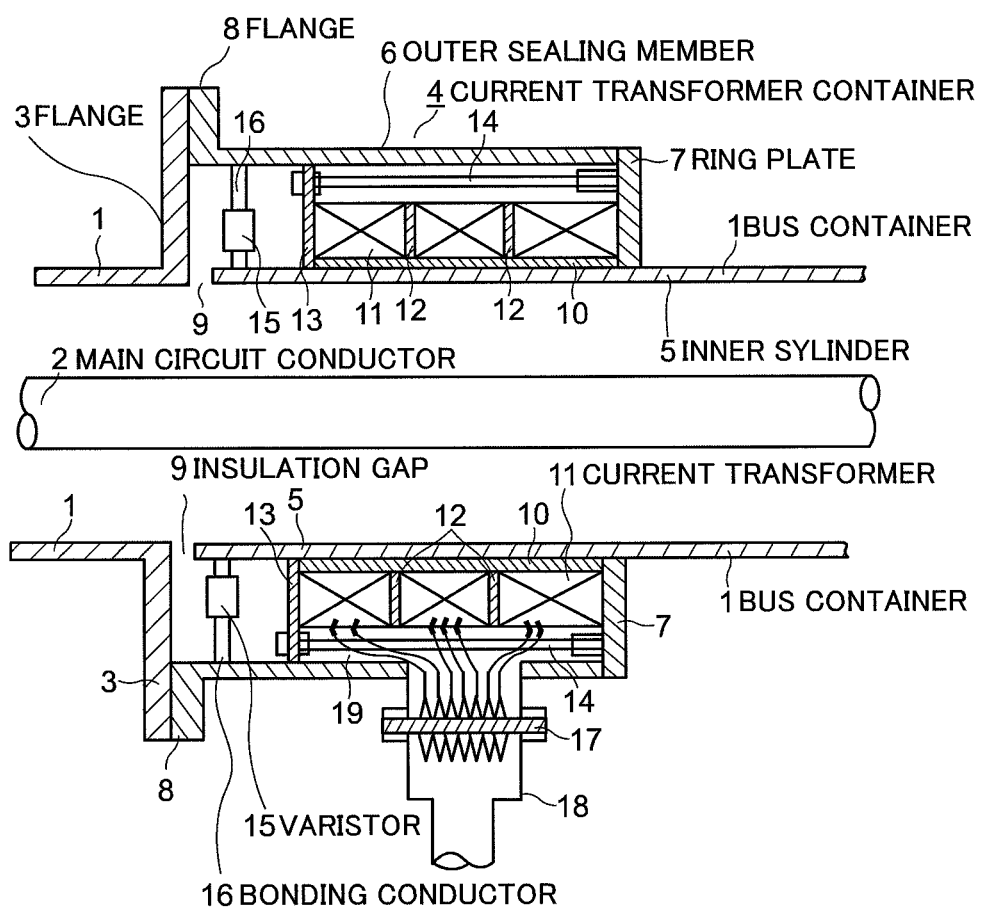
FIG. 1 is a cross-sectional view that illustrates a part of an embodiment of the present invention.

FIG. 1 illustrates an embodiment of the present invention. FIG. 1 is a cross-sectional view of a part of a gas insulated switchgear for the portion of one phase in a phase separation configuration.

As FIG. 1 illustrates, a bus container 1 of cylindrical shape is filled with insulating gas and houses a main circuit conductor 2 in taut condition. The bus container 1 has a flange 3. A current transformer container 4 is installed adjacently to the bus container 1. The current transformer container 4 includes an inner cylinder 5 and an outer sealing member 6. In this embodiment, a part of the bus container adjacent to the bus container 1 is used as the inner cylinder 5.

Between one longitudinal end of the outer sealing member 6 and the inner cylinder 5 is sealed with a ring plate 7 and the other longitudinal end of the outer sealing member 6 has a flange 8 that couples with the flange 3 of the bus container 1. The current transformer container 4 is fixed with bolts (not illustrated) to form a sealed chamber. And, the bolts join the flange 8 of the outer sealing member 6 to the flange 3 of the bus container 1. Thus, the area from the flange 8 of the outer sealing member 6 to the ring plate 7 forms the current transformer container 4. The insulating gas also fills inside the current transformer container 4.

The other longitudinal end of the inner cylinder 5 and the bus container 1 are arranged so that an insulation gap 9 is formed in between. The insulation gap 9 is formed around the entire periphery of the inner cylinder 5. On the periphery of the inner cylinder 5, an insulative cushioning material 10 of cylindrical shape is provided. On the periphery of the inner cylinder 5, three current transformers 11 are provided interposing the insulative cushioning material 10 in between. These current transformers 11 are configured in a triple-redundancy system.

The current transformers 11 are molded transformers and are arranged so that the current transformer 11 located on the right-side end in the figure will closely contact with the inner face of the ring plate 7. Among the current transformers 11, insulating ring plates 12 are interleaved. On the side face of the current transformer 11 located on the left-side end in the figure, a pressing plate 13 having a ring shape is arranged; the pressing plate 13 is coupled with the ring plate 7 with bolts 14.

Between the inner cylinder 5 and the outer sealing member 6 on the insulation gap 9 side, a varistor 15 (a non-linear resistor) of which resistance varies depending on the applied voltage is electrically connected through a bonding conductor 16. The varistor 15 turns into conducting state when a surge voltage over a predetermined intensity is applied. Three or so varistors 15 in number are installed on the circumference of the current transformer container 4 at an interval of about 120-degree for example.

On the current transformer container 4, an insulation pad 17 is provided. Over the insulation pad 17, a secondary circuit draw out tube 18 is coupled. The three current transformers 11 are connected to the insulation pad 17 through a secondary draw out wire 19. The signal of the current of the main circuit conductor 2 detected by the three current transformers 11 is transferred to a current measuring circuit (not illustrated) through the insulation pad 17 and the secondary draw out wire 19 in the secondary circuit draw out tube 18.

In this configuration, switching surge generated by operating a disconnecting switch or a similar device propagates into the main circuit conductor 2 from right to left in the figure in a form of a traveling wave. On the bus container 1 confronting the main circuit conductor 2, a high-frequency surge voltage is induced according to the inductance of the bus container 1, static capacity between the main circuit conductor 2 and the bus container 1, and other particulars related thereto.

The surge voltage induced on the bus container 1 travels on the bus container 1. Propagation of the induced surge voltage traveling on the bus container 1 is disturbed by the insulation gap 9 formed between the inner cylinder 5 and the bus container 1. This disturbance of propagation generates a surge voltage between the outer sealing member 6 and the main circuit conductor 2. Between the inner cylinder 5 and the outer sealing member 6 of the current transformer container 4, a differential surge voltage between the surge voltages on the outer sealing member 6 and on the main circuit conductor 2 is applied. This differential surge voltage reaches the order of tens of thousands of volts at its peak for example in a 500 kV power system.

Thus, the current transformer 11 becomes to be exposed to the surge voltage appeared between the outer sealing member 6 and the main circuit conductor 2 and is coupled to the surge voltage through stray capacities. In a conventional art therefore, a surge voltage of tens of thousands of volts is induced in the current transformer 11 and the induced surge voltage propagates into the secondary circuit.

Hereunder, an explanation is provided for eased understanding of the advantageous effects of the present invention taking an example taken from simulations conducted by the inventors of the present invention about switching surge voltage and the surge voltages applied on the inner and the outer sealing members of a current transformer container. The results of the simulation are based on a 500 kV power system.

Figure 2:
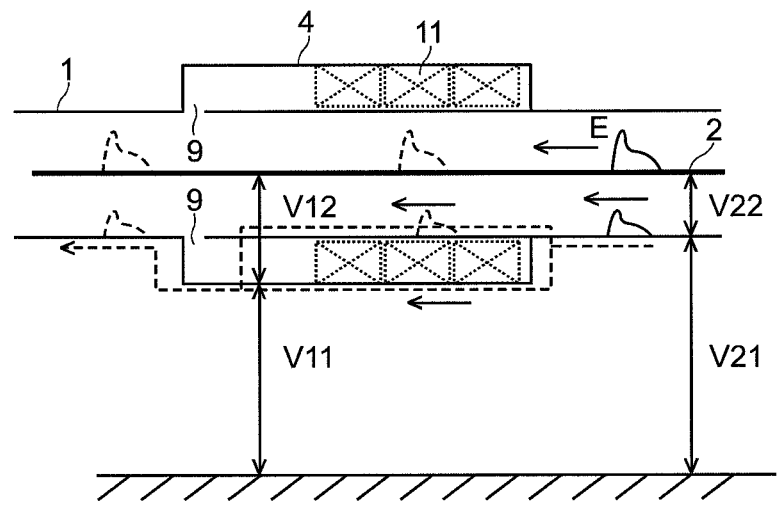
FIG. 2 is a schematic illustration of an aspect of the flow of the surge voltage to explain the present invention.

FIG. 2 is a flow-path diagram of the surge voltage. A calculation indicates that the switching surge voltage E on a disconnecting switch is 1225 kV at its peak. Expressing the voltage of the outer sealing member 6 of the current transformer container to ground as $V11$, the voltage between the main circuit conductor 2 and the outer sealing member 6 of the current transformer container as $V12$, the voltage of the bus container 1 to the ground as $V21$, and the voltage between the bus container 1 and the main circuit conductor 2 as $V22$; then the switching surge voltage E is given by the equation given below:

$$E = V11 + V12 = V21 + V22 \quad \text{(Eq. 1)}$$

Taking 1225 kV as the switching surge voltage E, calculations for the surge voltages $V21$ and $V22$ give $$V21 = 878 \text{ kV and } V22 = 347 \text{ kV}$$

The calculations in a similar manner give the surge voltages of $V11$ and $V12$ as shown below although the surge impedance of the bus container 1 for this portion is not the same because of the diameter of the current transformer container 4.

$$V11 = 842 \text{ kV and } V12 = 383 \text{ kV}$$

Between the inner cylinder 5 and the outer sealing member 6 of the current transformer container 4, a surge voltage is applied with an intensity of $$V21-V11=V12-V22=36 \text{ kV}$$

In a conventional art therefore, a surge voltage of about 36 kV is induced in the current transformer 11 and the induced surge voltage will propagate into the secondary circuit.

In the present invention, the varistor 15 is electrically connected between the inner cylinder 5 and the outer sealing member 6 of the current transformer container 4. The varistor 15 turns into conducting state when the surge voltage thereon reaches a predetermined varistor voltage to electrically connect the inner cylinder 5 with the outer sealing member 6. The varistor voltage of the varistor 15 is in the order of several thousand volts (between 20 kV and 30 kV), which means that a surge voltage of several thousand volts is applied on the secondary circuit.

Therefore, the surge voltage that would be applied on the secondary circuit of the current transformer reduces largely into one tenth or smaller. As a result of this, the reliability of the secondary circuit of the current transformer increases greatly contributing an enhanced stability to electric power systems.

Embodiment 2

Figure 3:
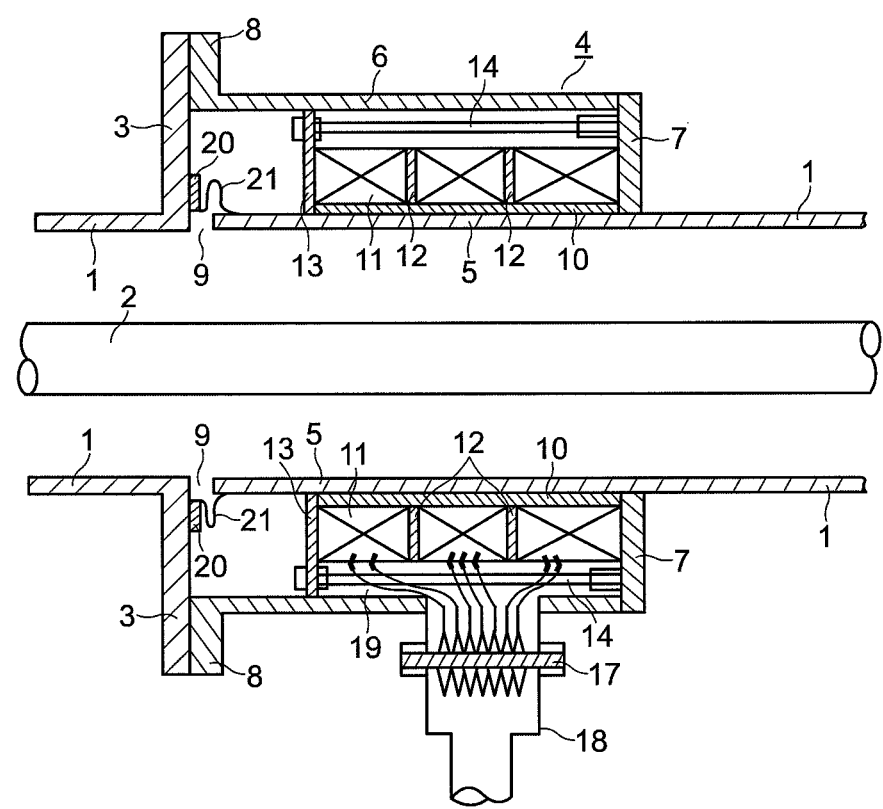
FIG. 3 is a cross-sectional view that illustrates a part of another embodiment of the present invention.

FIG. 3 illustrates another embodiment of the present invention. The embodiment illustrated in FIG. 3 is such an example that the insulation gap between the bus container and the inner cylinder of the current transformer container is electrically connected through a static capacity.

In FIG. 3, parts denoted by the same signs described in FIG. 1 denote such parts as are like or corresponding parts. And, a high-dielectric constant material coated plate 20 is affixed on the entire periphery of the flange 3 of the bus container 1 to which flange 3 of the other longitudinal end of the outer sealing member 6 of the current transformer container is coupled. As the high-dielectric constant material, such as epoxy primers or polytetrafluoroethylene (the registered trade name: Teflon) is applicable. The high-dielectric constant material coated plate 20 forms a capacitor having large static capacity, which behaves as a high-impedance in the commercial frequency range and becomes a low-impedance element in the high-frequency range of the surge voltage.

On the insulation gap, a conductive metallic bellows 21 is arranged. The metallic bellows 21 is installed on the entire periphery. One end of the metallic bellows 21 is fixed on the other longitudinal end of the inner cylinder 5 and the other end of the metallic bellows 21 is fused on the high-dielectric constant material coated plate 20. The high-dielectric constant material coated plate 20 is electrically connected to the other longitudinal end of the inner cylinder 5 through the metallic bellows 21. The metallic bellows 21 has a plurality of through holes (not illustrated) thereon to pass the insulating gas.

In the case of embodiment 2, when a high-frequency surge voltage is applied, the high-dielectric constant material coated plate 20 turns into conducting state to electrically connect the inner cylinder 5 with the outer sealing member 6. Because it is impossible to make the static capacity of the high-dielectric constant material coated plate 20 be infinitive, a surge voltage of about 1 kV may be applied on the secondary circuit; this magnitude is however a greatly reduced intensity.

As described above, the surge voltage that is applied on the secondary circuit of the current transformer in embodiment 2 can be greatly reduced as well as the reduction achieved in embodiment 1. Thereby, the reliability of the secondary circuit of the current transformer increases greatly contributing an enhanced stability to electric power systems.

In embodiment 2, the high-dielectric constant material coated plate 20 is arranged on the entire periphery of the flange 3. It may be however practicable to install the high-dielectric constant material coated plate 20 only on such a part as is needed where the static capacity obtainable thereby is enough. That is, it may be practicable to arrange two or more number of high-dielectric constant material coated plates 20 and the ordinary insulating plates in alternate configuration over the entire periphery of the flange 3; or instead, it may also be practicable to arrange two or more number of high-dielectric constant material coated plates 20 interleaving a predetermined dimension of gap in between.

The invention claimed is:

1. A gas insulated switchgear comprising:
   a bus container;
   a main circuit conductor being housed in the bus container in taut condition;
   a current transformer container being coupled to the bus container, the current transformer container including an inner cylinder and an outer sealing member;
   a current transformer being provided on the outer periphery of the inner cylinder;
   a ring plate being arranged between one longitudinal end of the outer sealing member and the inner cylinder to seal therebetween, and the other longitudinal end of the outer sealing member being connected to and fixed to a flange which is provided on one end of the bus container forming a sealed chamber;
   a gap being formed between a longitudinal end of the inner cylinder and the bus container; and
   a surge voltage suppressor being installed in a space between the flange and the current transformer,
   wherein the surge voltage suppressor is configured to turn into a conducting state to electrically connect the inner cylinder with the outer sealing member when an induced surge voltage caused by a switching surge voltage is applied therebetween.

2. The gas insulated switchgear according to claim 1, wherein the surge voltage suppressor is a non-linear resistor installed between the inner cylinder and the outer sealing member and electrically connecting therebetween, the non-linear resistor being configured to turn into a conducting state when the induced surge voltage applied therebetween is in excess of a predetermined value.

3. A gas insulated switchgear comprising:
   a bus container;
   a main circuit conductor being housed in the bus container in taut condition;
   a current transformer container being coupled to the bus container, the current transformer container including an inner cylinder and an outer sealing member;
   a current transformer being provided on the outer periphery of the inner cylinder;
   a ring plate being arranged between one longitudinal end of the outer sealing member and the inner cylinder to seal therebetween, and the other longitudinal end of the outer sealing member is connected to and fixed to the bus container forming a sealed chamber;
   a gap being formed between a longitudinal end of the inner cylinder and the bus container; and
   a surge voltage suppressor being installed between the inner cylinder and the outer sealing member, wherein the surge voltage suppressor is configured to turn into a conducting state to electrically connect the inner cylinder with the outer sealing member when an induced surge voltage caused by a switching surge voltage is applied therebetween; and wherein the surge voltage suppressor includes a high-dielectric constant material coated plate affixed on a flange of the bus container, the flange being connected to the other longitudinal end of the outer sealing member, and the high-dielectric constant material coated plate being electrically connected with the other longitudinal end of the inner cylinder.

\* \* \* \* \*